US012727078B2

(12) United States Patent
Ji et al.

(10) Patent No.: US 12,727,078 B2
(45) Date of Patent: Sep. 1, 2026

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Yunje Ji, Suwon-si (KR); Yonghoon Kim, Suwon-si (KR); Seungeun Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 109 days.

(21) Appl. No.: 18/228,160

(22) Filed: Jul. 31, 2023

(65) Prior Publication Data

US 2024/0172358 A1 May 23, 2024

(30) Foreign Application Priority Data

Nov. 17, 2022 (KR) ........................ 10-2022-0154437
Mar. 20, 2023 (KR) ........................ 10-2023-0035967

(51) Int. Cl.

| | |
|---|---|
| ***H05K 1/11*** | (2006.01) |
| ***H05K 1/02*** | (2006.01) |
| ***H05K 3/46*** | (2006.01) |
| *H05K 3/24* | (2006.01) |

(52) U.S. Cl.

CPC ........... *H05K 1/0298* (2013.01); *H05K 1/111* (2013.01); *H05K 3/467* (2013.01); *H05K 3/244* (2013.01); *H05K 2201/09472* (2013.01); *H05K 2201/2081* (2013.01)

(58) Field of Classification Search

CPC ......... H05K 1/0298; H05K 2201/2081; H05K 2201/09472; H05K 1/111; H05K 2201/09036; H05K 2201/0379

See application file for complete search history.

(56) References Cited

U.S. PATENT DOCUMENTS

| | | | |
|---|---|---|---|
| 8,158,508 B2 | 4/2012 | Lin et al. | |
| 8,946,742 B2 | 2/2015 | Yu et al. | |
| 9,881,858 B2 * | 1/2018 | Gandhi | H01L 23/49894 |
| 2003/0155638 A1 * | 8/2003 | Ito | H01L 21/4853 257/E21.503 |

(Continued)

FOREIGN PATENT DOCUMENTS

| | | |
|---|---|---|
| JP | 2011-134851 A | 7/2011 |
| JP | 2011-243714 A | 12/2011 |

(Continued)

OTHER PUBLICATIONS

Office Action dated Apr. 20, 2026 in corresponding Korean Patent Application No. 10-2023-0035967 with English translation.

*Primary Examiner* — Steven T Sawyer

(74) *Attorney, Agent, or Firm* — Morgan, Lewis & Bockius LLP

(57) ABSTRACT

A circuit board including: an insulation layer having a first surface and a second surface facing each other; a first pad layer including a first connection pad and a first conductive layer stacked on the first connection pad, a portion of the first pad layer buried in the insulation layer, and another portion of the first pad layer protruding from a first surface of the insulation layer; and a second conductive layer disposed on the first conductive layer.

14 Claims, 17 Drawing Sheets

(56) References Cited

U.S. PATENT DOCUMENTS

2010/0132997 A1* 6/2010 Hando ................. H05K 3/4682
29/850
2011/0284269 A1 11/2011 Maeda et al.
2016/0050752 A1* 2/2016 Kang ..................... H05K 3/243
174/257
2016/0064319 A1* 3/2016 Suzuki .................. H01L 23/492
174/251
2016/0242277 A1* 8/2016 Lee ...................... H05K 3/4007
2016/0315042 A1* 10/2016 Yoon ..................... H01L 21/288
2017/0018489 A1* 1/2017 Gandhi ............. H01L 23/49811
2017/0040249 A1* 2/2017 Yanagisawa ........... H05K 1/111
2025/0089172 A1* 3/2025 Kim ........................ H01L 23/12

FOREIGN PATENT DOCUMENTS

KR 10-2016-0026710 A 3/2016
KR 10-2017-0122500 A 11/2017

* cited by examiner

CIRCUIT BOARD AND MANUFACTURING METHOD THEREOF

CROSS-REFERENCE TO RELATED APPLICATIONS

This application claims priority to and the benefit of Korean Patent Application No. 10-2023-0035967 filed in the Korean Intellectual Property Office on Mar. 20, 2023, and Korean Patent Application No. 10-2022-0154437 filed in the Korean Intellectual Property Office on Nov. 17, 2022, the entire contents of which are incorporated herein by reference.

BACKGROUND

1. Technical Field

The present disclosure relates to a circuit board and a manufacturing method thereof.

2. Description of the Related Art

As the electronic industry develops, electronic devices gradually gain higher performance, and semiconductor packages resultantly need smaller designs with greater density. As the number of ICs installed in the package increases, the number of I/O access terminals increases, and requirements for reducing a gap between bonding pads are given.

Currently, a wire bonding method and a flip bonding method are used for the high-density package, and when the number of the I/O access terminals increases, the flip bonding method is preferred. However, the wire bonding method also needs a bond finger and a nickel plating layer for fine circuits, and in this instance, it is required to block the nickel plating layer from spreading to the right and left sides of the bonding pad and realize the same with fine pitch.

SUMMARY

The present disclosure attempts to provide a circuit board for realizing a connection pad for installing a wire bonding chip with a fine pitch and having a protruding conductive layer that is appropriate for a wire bonding environment, and a method for manufacturing a circuit board.

The object of the present invention is not limited to the above-described object, and it may be expanded in various ways in the range of the ideas and the areas of the present invention.

An embodiment of the present disclosure provides a circuit board including: an insulation layer having a first surface and a second surface facing each other; a first pad layer including a first connection pad and a first conductive layer stacked on the first connection pad, a portion of the first pad layer buried in the insulation layer, and another portion of the first pad layer protruding from a first surface of the insulation layer; and a second conductive layer disposed on the first conductive layer.

The first connection pad may be buried in the insulation layer, and an upper surface of the first connection pad may be recessed into the insulation layer.

The first conductive layer may overlap the upper surface of the first connection pad in a thickness direction of the insulation layer, and a portion may be buried in the insulation layer and another portion may protrude from the first surface.

The second conductive layer may be disposed on an upper surface of the first conductive layer protruding from the first surface.

The second conductive layer may cover a lateral surface of the first conductive layer protruding from the first surface.

The first connection pad may include a copper (Cu) layer.

The first conductive layer may include a nickel (Ni) plating layer.

The second conductive layer may include a gold (Au) plating layer.

A width of the first conductive layer may be substantially equal to a width of the first connection pad.

The first pad layer may be disposed in a bond finger region.

An upper surface of the insulation layer disposed in the bond finger region may be lower than an upper surface of the insulation layer adjacent to the bond finger region.

The circuit board may further include a solder resist layer disposed on the insulation layer adjacent to the bond finger region.

The insulation layer may include a plurality of insulation layers, and the plurality of insulation layers may include a plurality of circuit layers.

An embodiment of the present disclosure provides a method of manufacturing a circuit board including: providing an embedded pattern substrate including an insulation layer having a first surface and a second surface facing each other and a first connection pad buried in the insulation layer to be recessed into the insulation layer; forming a first pad layer by stacking a first conductive layer on the first connection pad to overlap the first connection pad; etching the insulation layer such that a first surface of the insulation layer is disposed between an upper surface and a lower surface of the first pad layer; and forming a second conductive layer on the first conductive layer.

The method may further include, before the providing of the embedded pattern substrate, forming the embedded pattern substrate including burying the first connection pad in the insulation layer, and etching an upper surface of the first connection pad to be recessed into the insulation layer.

The etching of the insulation layer may include etching using a plasma treatment process.

The etching of the insulation layer may include forming an upper surface of the first connection pad to be recessed into the insulation layer; and forming an upper surface of the first conductive layer to be higher than the first surface of the insulation layer.

The etching of the insulation layer may be performed such that the first conductive layer may protrude from the insulation layer, and then the forming of the second conductive layer may include plating the second conductive layer on the first conductive layer to form the second conductive layer.

The forming of the second conductive layer may include plating the second conductive layer on the first conductive layer before the etching of the insulation layer.

An embodiment of the present disclosure provides a circuit board including an insulation layer having a first surface and a second surface facing each other; a first pad layer including a first portion buried in the insulation layer, and a second portion protruding from the first surface of the insulation layer, the first portion including a material different from a material present in the second portion; and a second conductive layer disposed on the first pad layer.

The first portion may include a first connection pad buried in the insulation layer, and an upper surface of the first connection pad may be recessed into the insulation layer.

The second portion may include a first conductive layer overlapping the upper surface of the first connection pad in a thickness direction of the insulation layer, and a portion of the first conductive layer may be buried in the insulation layer and another portion of the first conductive layer protrudes from the first surface.

The material included in the first portion may include copper (Cu).

The material included in the second portion may include nickel (Ni).

The second conductive layer may include gold (Au).

The insulation layer may include a resin.

An embodiment of the present disclosure provides a method of manufacturing a circuit board, including: forming a first pad layer in an embedded pattern substrate that includes an insulation layer, wherein the first pad layer includes a first portion buried in the insulation layer, and a second portion protruding from a surface of the insulation layer, and the first portion including a material different from a material present in the second portion; etching the insulation layer such that the surface of the insulation layer is disposed between an upper surface and a lower surface of the first pad layer; and forming a second conductive layer on the first pad layer.

The method may further include, before the forming of the first pad layer, forming the embedded pattern substrate including: burying the first portion in the insulation layer, and etching an upper surface of the first portion to be recessed into the insulation layer.

The etching of the insulation layer may include etching using a plasma treatment process.

The etching of the insulation layer may include forming an upper surface of the first portion to be recessed into the insulation layer; and forming an upper surface of the second portion to be higher than the first surface of the insulation layer.

The first portion may include a first connection pad buried in the insulation layer, the second portion may include a first conductive layer overlapping the upper surface of the first connection pad in a thickness direction of the insulation layer, a portion of the first conductive layer may be buried in the insulation layer, and another portion of the first conductive layer may protrude from the surface of the insulation layer.

According to the method for manufacturing a circuit board according to the embodiments, the connection pad for installing a wire bonding chip may be realized with a fine pitch and the protruding conductive layer that is appropriate for the wire bonding environment may be manufactured.

Therefore, the circuit board according to the embodiments may be configured with the fine pitch that is equal to or less than 55 pitch by manufacturing the bond finger for a wire bonding by an embedded trace substrate (ETS) method.

Further, the nickel plating layer of the bond finger pad protrudes to thus remove the erroneous access risks for a wire bonding process.

BRIEF DESCRIPTION OF THE DRAWINGS

FIG. 1 shows a cross-sectional view of a circuit board according to an embodiment.

FIG. 2A to FIG. 2D, FIG. 3A to FIG. 3D, and FIG. 4A to FIG. 4C show processing diagrams of a method for manufacturing a circuit board shown in FIG. 1.

FIG. 6A and FIG. 7A show processing diagrams of a method for manufacturing a circuit board according to another embodiment.

DETAILED DESCRIPTION

Figure 2A:
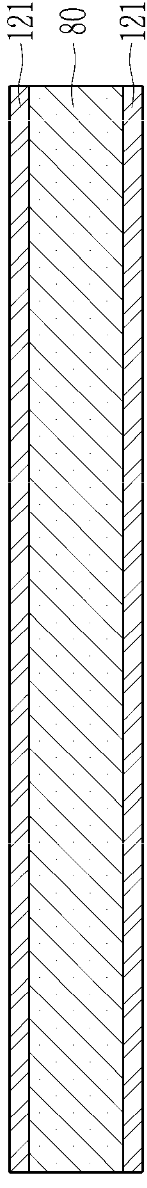

In the following detailed description, only certain embodiments of the present disclosure have been shown and described, simply by way of illustration. The drawings and description are to be regarded as illustrative in nature and not restrictive. Like reference numerals designate like elements throughout the specification. Some constituent elements are exaggerated, omitted, or briefly illustrated in the added drawings, and sizes of the respective constituent elements do not reflect the actual sizes.

The accompanying drawings are provided only in order to allow embodiments disclosed in the present specification to be easily understood and are not to be interpreted as limiting the spirit disclosed in the present specification, and it is to be understood that the present disclosure includes all modifications, equals, and substitutions without departing from the scope and spirit of the present disclosure.

Terms including ordinal numbers such as first, second, and the like will be used only to describe various constituent elements, and are not to be interpreted as limiting these constituent elements. The terms are only used to differentiate one constituent element from other constituent elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper surface of the object portion based on a gravitational direction.

It should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. Unless explicitly described to the contrary, the word "comprise" and variations such as "comprises" or "comprising" will be understood to imply the inclusion of stated elements but not the exclusion of any other elements.

The phrase "in a plan view" or "on a plane" means viewing a target portion from the top, and the phrase "in a cross-sectional view" or "on a cross-section" means viewing a cross-section formed by perpendicularly cutting a target portion from the side.

Throughout the specification, when it is described that a part is "connected" to another part, the part may be "directly connected" to the other element, may be "connected" to the other part through a third part, or may be connected to the other part physically or electrically, and may be referred to by different titles depending on positions or functions, but respective portions that are substantially integrated into one body may be connected to each other.

The substrate may be wide in a plan view and may be thin in a cross-sectional view, "a planar direction of the substrate" may represent a direction that is parallel to a wide and flat side of the substrate, and "a thickness direction of the substrate" may represent a direction that is perpendicular to the wide and flat side of the substrate.

The term "substantially equal" includes not only numerically exactly the same but also those that are designed to be the same size but that may differ slightly within tolerances due to manufacturing processes or material properties, such that they would be considered identical by a person of ordinary skill in the art.

Figure 1:
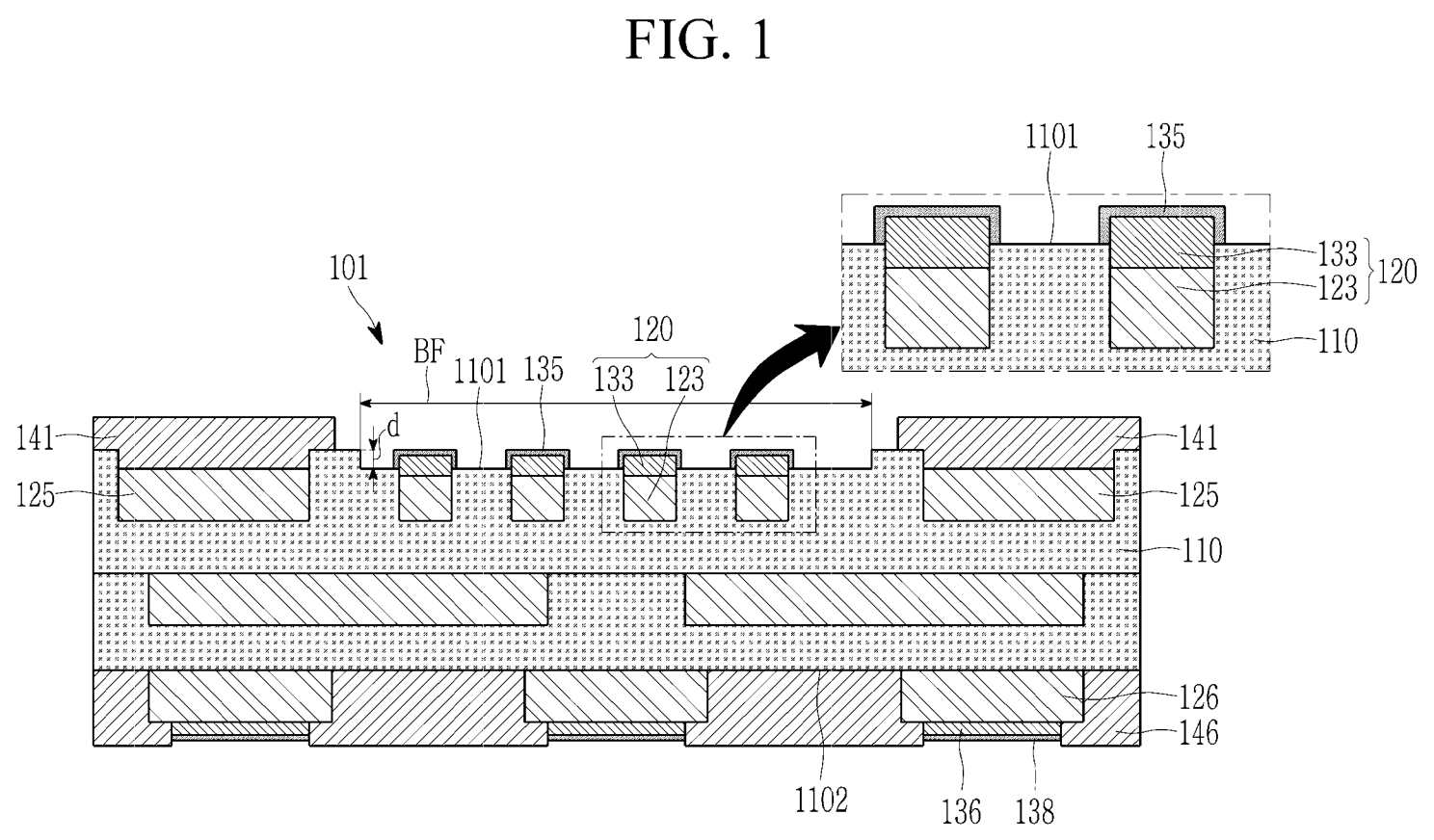

FIG. 1 shows a cross-sectional view of a circuit board according to an embodiment.

Referring to FIG. 1, the circuit board 101 includes an insulation layer 110 and a first connection pad 123 buried in the insulation layer 110. The insulation layer 110 and the first connection pad 123 may configure (constitute) an embedded pattern substrate. The circuit board 101 may be used as a printed circuit board (PCB) for a semiconductor package.

The insulation layer 110 may include a first surface 1101 and a second surface 1102 facing each other. A first conductive layer 133 may be stacked on the first connection pad 123 to configure (form) a first pad layer 120. A portion of the first pad layer 120 may be buried in the insulation layer 110 and another portion of the first pad layer 120 may protrude from the first surface 1101 of the insulation layer 110. A second conductive layer 135 may be disposed on the first conductive layer 133.

The insulation layer 110 may include a resin insulation layer. The insulation layer 110 may use a thermo-curable resin such as an epoxy resin, a thermoplastic resin such as a polyimide, or a resin, e.g., a prepreg, to which a reinforcing member such as glass fibers or an inorganic filler is impregnated, and may include a thermo-curable resin and/or a photocurable resin, and it is not limited thereto.

The first connection pad 123 is buried in the insulation layer 110, and its upper surface may be recessed from the exposed first surface 1101 of the insulation layer 110. The first conductive layer 133 overlaps the upper surface of the first connection pad 123 so a portion of the first conductive layer 133 may be buried in the insulation layer 110 and another portion of the first conductive layer 133 may protrude from the first surface 1101 of the insulation layer 110. The second conductive layer 135 may be disposed on a protruding upper surface and a lateral surface of the first conductive layer 133.

The first connection pad 123 may include a copper (Cu) layer. The first conductive layer 133 may include a nickel (Ni) plating layer, and the second conductive layer 135 may include a gold (Au) plating layer. The first conductive layer 133 may be thicker than the second conductive layer 135.

In the present embodiment, the first conductive layer 133 and the second conductive layer 135 may be formed by an electrolytic nickel/gold plating method. That is, the nickel plating layer and the gold plating layer may be formed by a method for forming a nickel/gold metal film by applying a current to the first connection pad 123 including copper. The first conductive layer 133 and the second conductive layer 135 may be formed by an electroless nickel/gold plating method.

When the circuit board 101 is seen in a cross-sectional view with respect to a thickness direction, a width of the first conductive layer 133 may be substantially equal to a width of the first connection pad 123. The width of the first conductive layer 133 may be equal to the width of the first connection pad 123 at a portion on which the first conductive layer 133 contacts the first connection pad 123, and the width of the upper surface of the first conductive layer 133 may be equal to the width of the first connection pad 123. The width of the first conductive layer 133 buried in the insulation layer 110 may be equal to the width of the first conductive layer 133 protruding from the insulation layer 110. Therefore, the first conductive layer 133 may be formed to be not greater than the width of the first conductive layer 133 buried in the insulation layer 110 in a planar direction of the substrate on the first surface 1101 of the insulation layer 110. The widths may be measured by an optical microscope or electron microscope. Other methods and/or tools appreciated by one of ordinary skill in the art, even if not described in the present disclosure, may also be used.

The insulation layer 110 may include a wire bonding pad having a bond finger region BF. In this instance, the first connection pad 123 may be a bond finger disposed in the bond finger region BF, and a plurality of first connection pads 123 may configure a plurality of bond fingers. That is, the first connection pad 123 may be configured with a bond finger for a wire bonding pad, and a conductive wire may be bonded to the first connection pad 123 when the semiconductor chip is wire-bonded.

The upper surface of the insulation layer 110 disposed in the bond finger region BF may be lower than the upper surface of the insulation layer 110 adjacent to the bond finger region BF. That is, the upper surface of the insulation layer 110 in the region in which the first connection pad 123 is disposed may be lower than the upper surface of the insulation layer 110 by a height difference (d).

A first solder resist layer 141 may be disposed on the insulation layer 110 adjacent to the bond finger region BF. The first solder resist layer 141 may overlap the circuit layer 125 disposed in the insulation layer 110 and may cover the circuit layer 125.

A second connection pad 126 may be further formed on the second surface 1102 of the insulation layer 110. A second solder resist layer 146 may be formed around the second connection pad 126 on the second surface 1102 of the insulation layer 110. The second connection pad 126 may include a copper (Cu) layer, and a conductive layer may be formed on the second connection pad 126. The conductive layer may include a first conductive layer 136 including a nickel (Ni) plating layer, and a second conductive layer 138 including a gold (Au) plating layer. The nickel plating layer may be formed on the second connection pad 126 and the gold plating layer may be formed on the nickel plating layer.

A plurality of second connection pads 126 may be arranged neighboring each other on the second surface 1102 of the insulation layer 110. A second solder resist layer 146 may be formed among the respective second connection pads 126. That is, the second solder resist layer 146 may separate the neighboring second connection pads 126.

The circuit board 101 shown in FIG. 1 has a structure in which the connection pads 123 and 126 are disposed on the respective sides or both sides of the insulation layer 110, and the second connection pad 126 disposed on the second surface 1102 of the insulation layer 110 may be omitted, which also belongs to the range of the present disclosure. Another embodiment and a modified example to be given below belong to the above-noted range.

The insulation layer 110 may include a plurality of insulation layers, and the insulation layers may respectively include a circuit layer. Therefore, the circuit layer is formed on the respective insulation layer of at least three layers, and a via may extend in the thickness direction of the insulation layer to connect the circuit layers.

FIG. 2A to FIG. 2D, FIG. 3A to FIG. 3D, and FIG. 4A to FIG. 4C show processing diagrams of a method for manufacturing a circuit board shown in FIG. 1. FIG. 3E is an enlarged view of the area A illustrated in FIG. 3D.

Figure 2B:
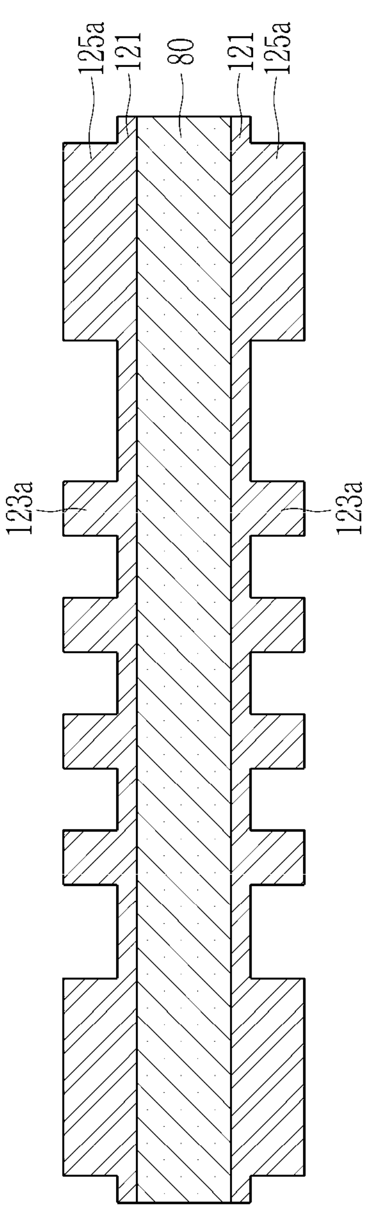

As shown in FIG. 2A and FIG. 2B, a carrier substrate 80 on which a first seed layer 121 is stacked is provided, and first circuit pattern layers 123*a* and 125*a* are formed on the first seed layer 121 according to a circuit forming process. That is, a plating resist patterned by exposure and development may be formed on a portion on which first circuit pattern layers 123*a* and 125*a* will be formed on the carrier substrate 80. The first circuit pattern layers 123*a* and 125*a* may be formed by plating a conductive metal on the first seed layer 121 exposed through an opening of a patterned plating resist. The plating resist pattern is removed when the first circuit pattern layers 123*a* and 125*a* are formed.

As the first seed layer 121, conductive metals used for circuits in the circuit board field may be applicable without limits, and copper is generally used. The carrier substrate 80 may represent a substrate in which a copper foil layer is stacked on respective sides or both sides of an insulator, and the first seed layer 121 may be separated from the copper foil layer. The first circuit pattern layers 123*a* and 125*a* may be connected to the first seed layer 121 of the carrier substrate 80, and may include a same type of metal as the first seed layer 121. For example, the first seed layer 121 and the first circuit pattern layers 123*a* and 125*a* may include copper.

The first circuit pattern layers 123*a* and 125*a* are formed on respective sides or both sides of the carrier substrate 80 in the present embodiment, the first circuit pattern layers 123*a* and 125*a* may also be formed on one side of the carrier substrate 80, which belongs to the range of the present disclosure.

Figure 2C:
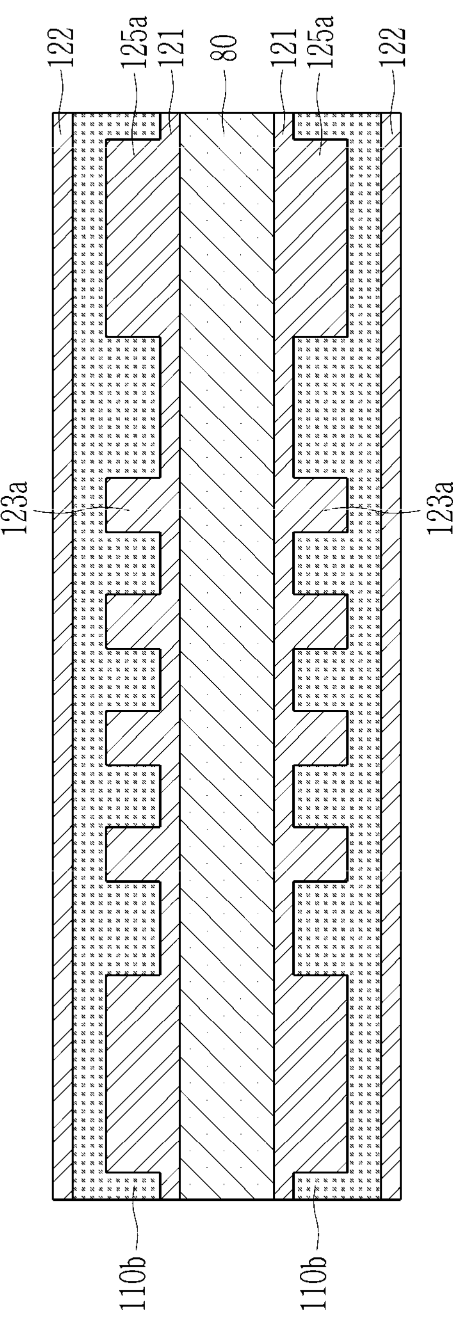

Referring to FIG. 2C, an insulation layer 110*b* is stacked so that the first circuit pattern layers 123*a* and 125*a* may be buried, and a second seed layer 122 is formed on an upper surface of the insulation layer 110*b*. The second seed layer 122 may be formed to form an intermediate circuit layer 124, conductive metals may be used without limits, and copper is generally used.

The insulation layer 110*b* may include a resin insulation layer. The insulation layer 110*b* may use a thermo-curable resin such as an epoxy resin, a thermoplastic resin such as a polyimide, or a resin, e.g., a prepreg, to which a reinforcing member such as glass fibers or an inorganic filler is impregnated, and may include a thermo-curable resin and/or a photocurable resin, and it is not limited thereto.

Figure 2D:
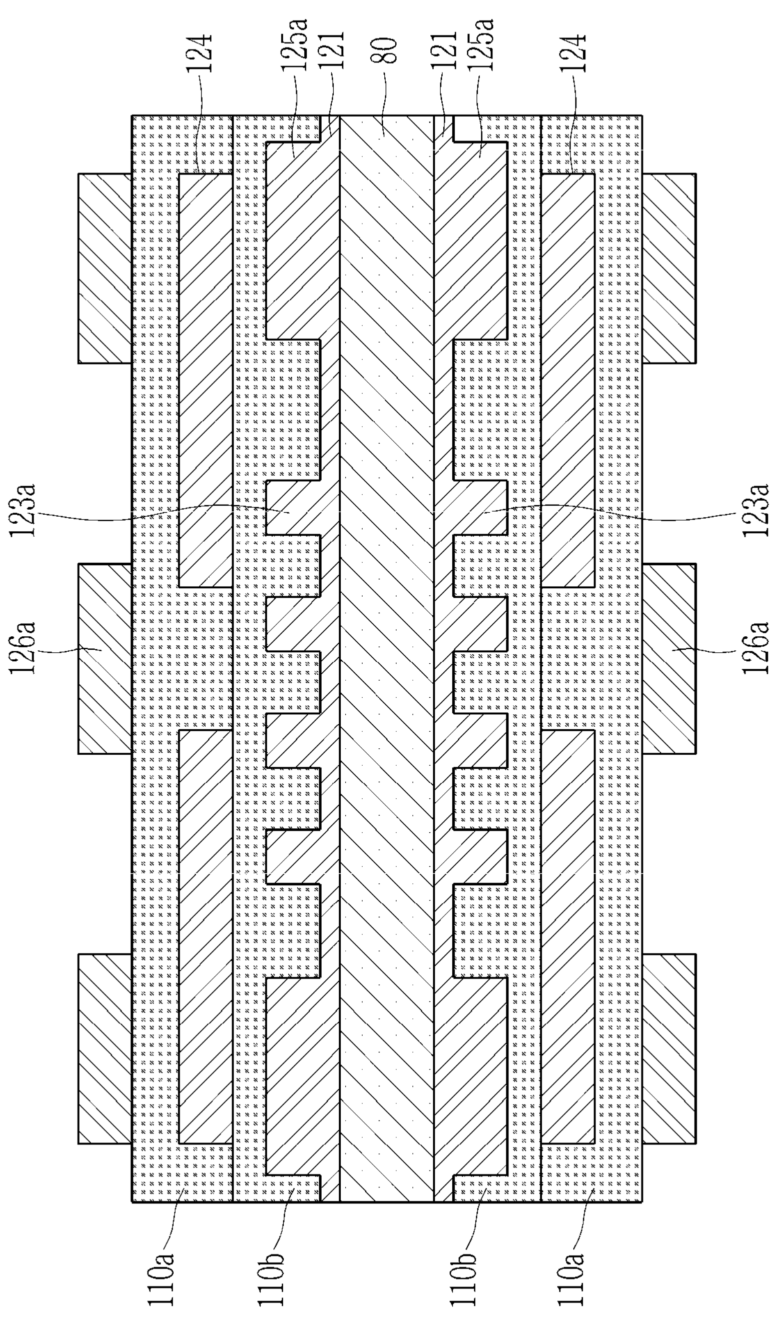

Referring to FIG. 2D, a second circuit pattern layer 126*a* may be formed on an outermost insulation layer 110*a* according to a circuit forming process. The second circuit pattern layer 126*a* may be formed by a method that is similar to a method for forming the first circuit pattern layers 123*a* and 125*a*, and the second circuit pattern layer 126*a* may include a same material as the first circuit pattern layers 123*a* and 125*a*. Hence, embedded pattern substrate portions are formed on the respective sides or both sides of the carrier substrate 80.

According to the shown embodiment, the respective embedded pattern substrate portions include two insulation layers 110*a* and 110*b*, and three metal layers including first circuit pattern layers 123*a* and 125*a*, an intermediate circuit layer 124, and a second circuit pattern layer 126*a*, and without being limited thereto, it may include a greater number of insulation layers and circuit patterns, which belongs to the range of the present disclosure.

Figure 3A:
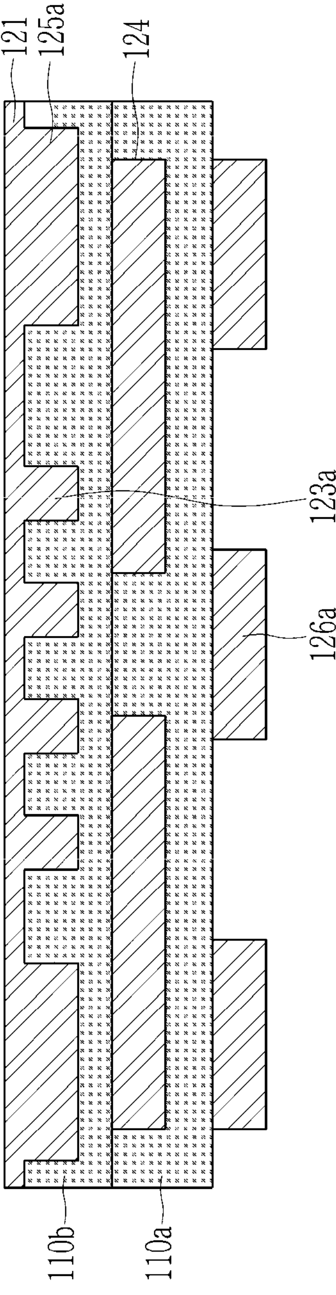

Referring to FIG. 3A, an embedded pattern substrate is provided by separating the first seed layer 121 and the carrier substrate 80. One pair of embedded pattern substrates may be obtained by separating the first seed layer 121 formed on respective sides or both sides of the carrier substrate 80, and individual processes may be applied to the one pair of embedded pattern substrates.

Figure 3B:
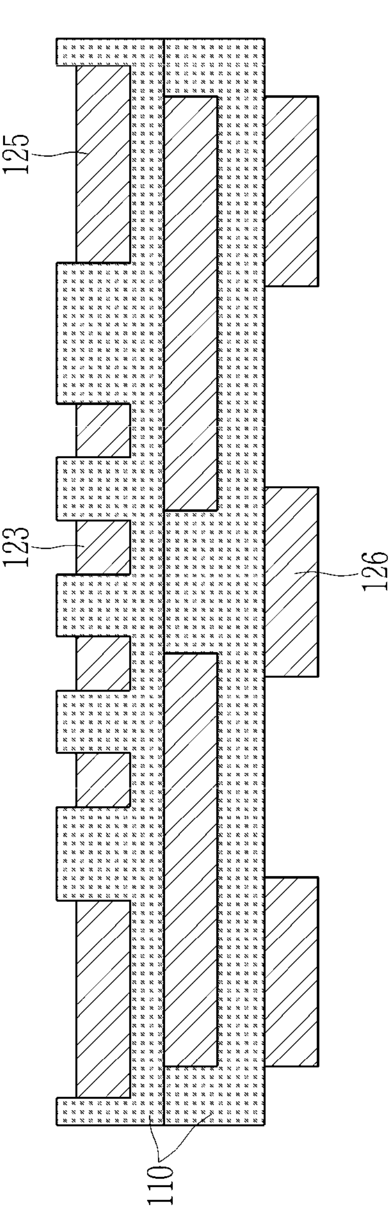

Referring to FIG. 3B, the first seed layer 121 is removed by soft etching the embedded pattern substrate obtained in FIG. 3A. The first circuit pattern layers 123*a* and 125*a* buried in the insulation layer 110*b* form a first connection pad 123 and a circuit layer 125, and the second circuit pattern layer 126*a* disposed on the insulation layer 110*a* forms a second connection pad 126. In the process of removing the first seed layer 121, the surfaces of the first circuit pattern layers 123*a* and 125*a* exposed from the insulation layer 110*b* are also partially etched, so that the first connection pad 123 and the circuit layer 125 may be formed to be recessed from the surface of the insulation layer 110*b*.

Figure 3C:
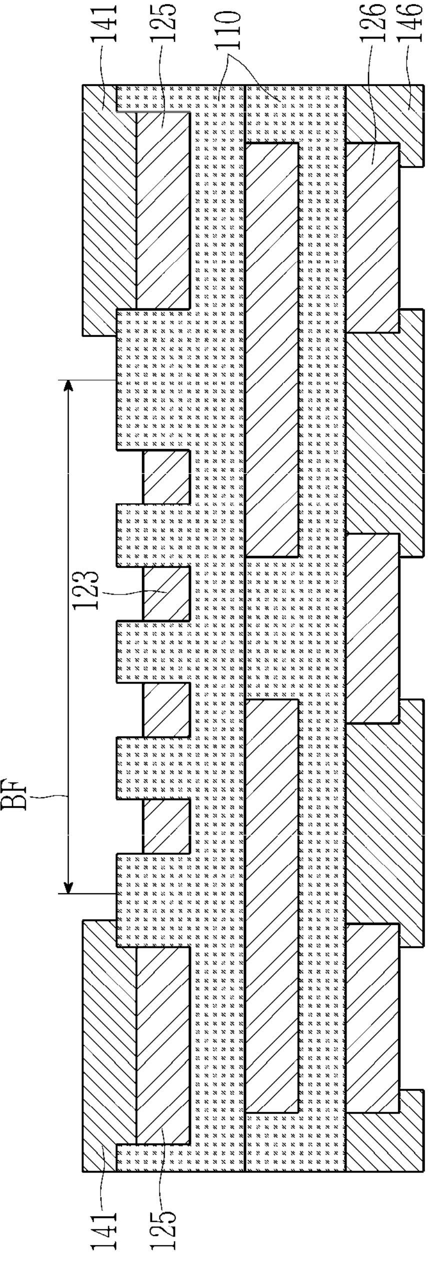
Figure 3D:
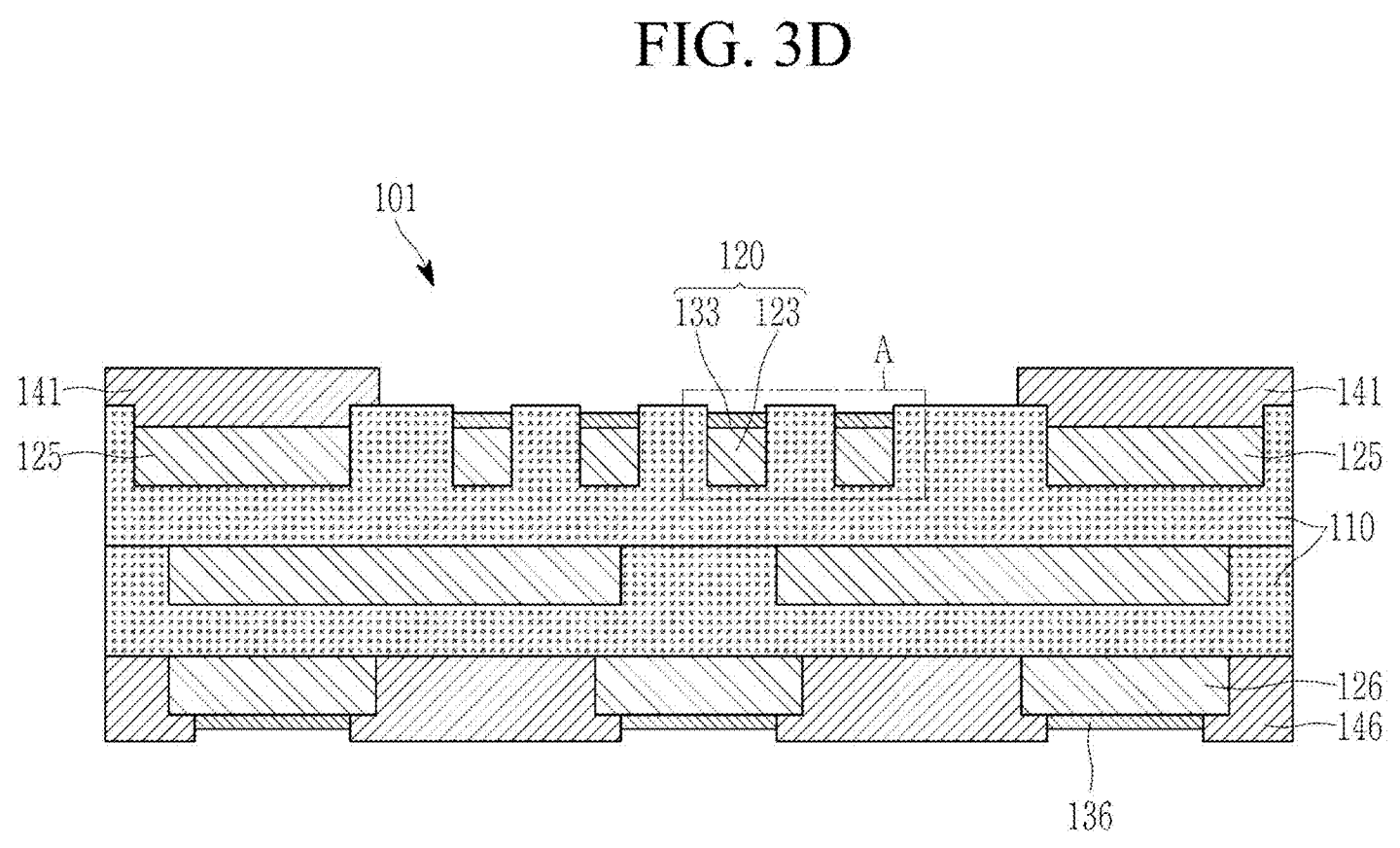
Figure 3E:
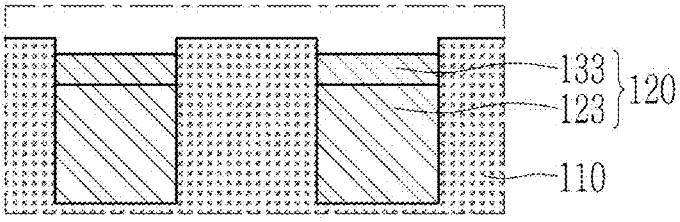
FIG. 3E is an enlarged view of an area A illustrated in FIG. 3D.

Referring to FIG. 3C, a solder masking process is used to form a first solder resist layer 141 that partially covers the upper surface of the circuit layer 125 and the insulation layer 110, and a second solder resist layer 146 that covers the lower surface of the second connection pad 126 and the insulation layer 110. In this instance, the first solder resist layer 141 may be patterned to expose the bond finger region BF, and the second solder resist layer 146 may be patterned to at least partially expose the second connection pad 126.

The solder resist layers 141 and 146 function as passivation layers for protecting an outermost-layer circuit, and are present for electrical insulation. The solder resist layers 141 and 146 may be configured into, for example, a solder resist ink, a solder resist film, or a capsuling agent by a person skilled in the art, but is not limited thereto.

Referring to FIG. 3D, first conductive layers 133 and 136 are formed on the first connection pad 123 and the second connection pad 126 exposed through the openings of the solder resist layers 141 and 146. The first conductive layers 133 and 136 include nickel plating layers and they may be formed by an electroplating method. That is, the nickel plating layer may be formed by a method for forming a nickel metal film by applying a current to the first and second connection pads 123 and 126 including copper. The first conductive layers 133 and 136 may also be formed by an electroless plating method. The first conductive layers 133 and 136 formed on the connection pads 123 and 126 may be recessed from the surface of the insulation layer 110 or the second solder resist layer 146, respectively.

Figure 4A:
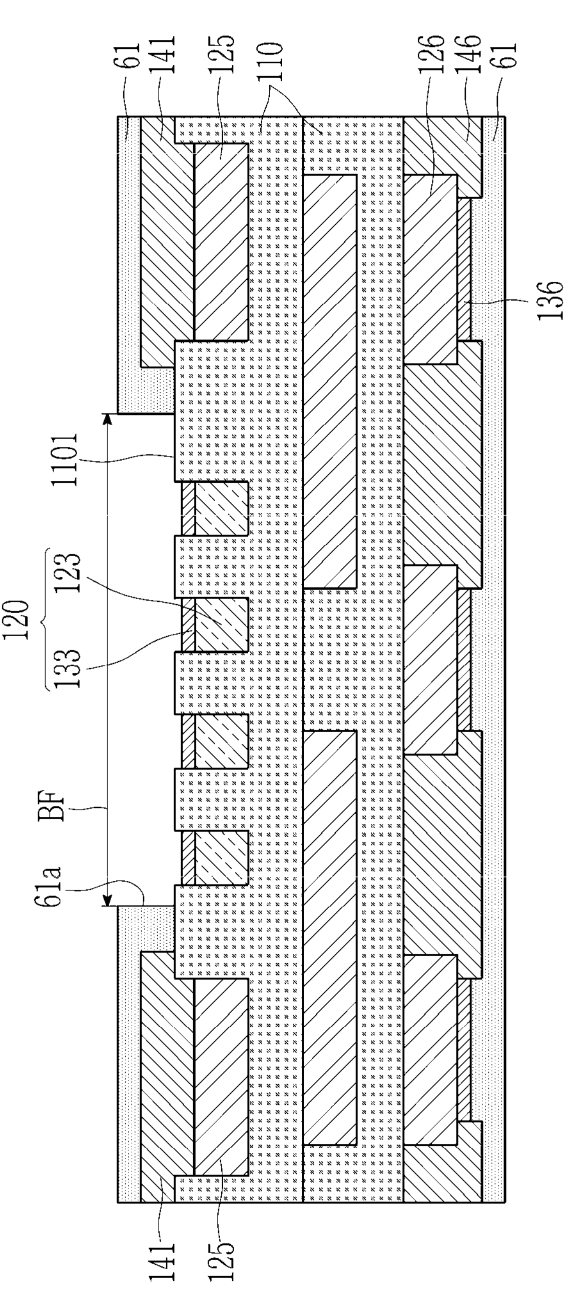

Referring to FIG. 4A, a patterned covering mask 61 is covered on the surface of the embedded pattern substrate obtained in FIG. 3D and plasma etching is performed. The covering mask 61 may have an opening 61*a* overlapping the bond finger region BF formed on the first surface 1101 of the insulation layer 110 configuring the embedded pattern substrate. Therefore, the first solder resist layer 141 disposed on the first surface 1101 of the insulation layer 110 is covered by the covering mask 61, and a region of the first surface 1101 of the insulation layer 110 on which the first pad layer 120 including the first connection pad 123 and the first conductive layer 133 is disposed may be exposed. The exposed region of the first surface 1101 of the insulation layer 110 may be plasma-etched. The second connection pad 126, the first conductive layer 136, and the second solder resist layer 146 disposed on the second surface 1102 of the insulation layer 110 may be entirely covered by the covering mask 61.

Figure 4B:
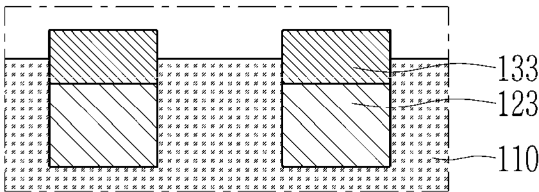

Referring to FIG. 4B, when the first surface 1101 of the insulation layer 110 is etched according to a plasma process, part of the first conductive layer 133 of the first pad layer 120 may protrude from the first surface 1101. That is, before plasma etching, the first conductive layer 133 is recessed and disposed below the first surface 1101 of the insulation layer 110 (see FIG. 4A), and after the plasma etching, the surface of the insulation layer 110 may be disposed lower than the surface of the first conductive layer 133.

Figure 4C:
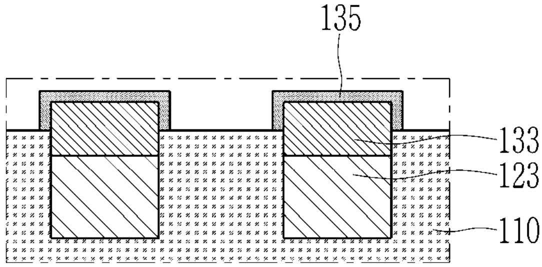

Referring to FIG. 4C, a second conductive layer 135 is formed along the surface of the first conductive layer 133 protruding at the first surface 1101 of the insulation layer 110. The second conductive layer 135 may include a gold (Au) plating layer and may be formed by an electroplating method. That is, the gold plating layer may be formed by a method for forming a gold film by applying a current to the first connection pad 123. The second conductive layer 135 may be formed by an electroless plating method. As the plating process is performed while the first conductive layer 133 protrudes at the insulation layer 110, the second conductive layer 135 may be plated on the protruding upper surface and the lateral surface of the first conductive layer 133.

A second conductive layer 138 (see FIG. 1) may be formed on the first conductive layer 136 disposed on the second surface 1102 of the insulation layer 110 and disposed on the second connection pad 126 exposed from the second solder resist layer 146. Hence, the circuit board 101 as shown in FIG. 1 may be completed.

Figure 5A:
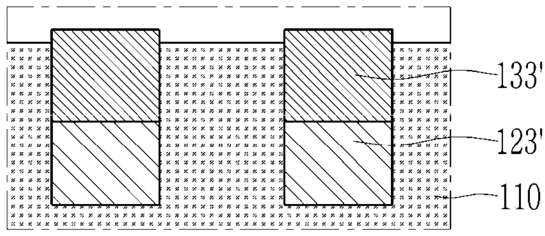
FIG. 5A to FIG. 5C show processing diagrams of a method for manufacturing a circuit board according to a modified example.
Figure 5B:
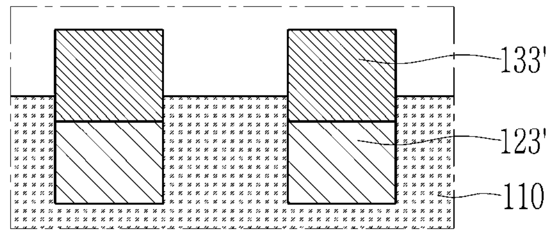
Figure 5C:
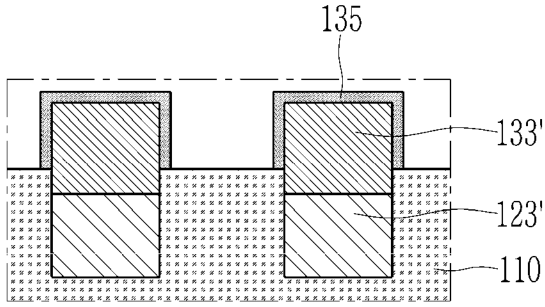

FIG. 5A to FIG. 5C show processing diagrams of a method for manufacturing a circuit board according to a modified example. FIG. 5A shows a first connection pad 123' buried in the insulation layer 110 before a plasma etching, FIG. 5B shows that the first conductive layer 133' protrudes from the insulation layer 110 after the plasma etching, and FIG. 5C shows that the second conductive layer 135' is plated on the protruding first conductive layer 133'.

Referring to FIG. 5A, in the present modified example, when the first conductive layer 133' is formed on the first connection pad 123', the first conductive layer 133' may be plated to be thicker than the substrate shown in FIG. 4A. Therefore, part of the first conductive layer 133' disposed on the first connection pad 123' may protrude from the first surface 1101 of the insulation layer 110.

Referring to FIG. 5B and FIG. 5C, in the present modified example, the first conductive layer 133' may protrude by etching part of the upper surface of the insulation layer 110 by a plasma etching, and the second conductive layer 135' may be plated along the upper surface and the lateral surface of the protruding first conductive layer 133'.

Figure 6A:
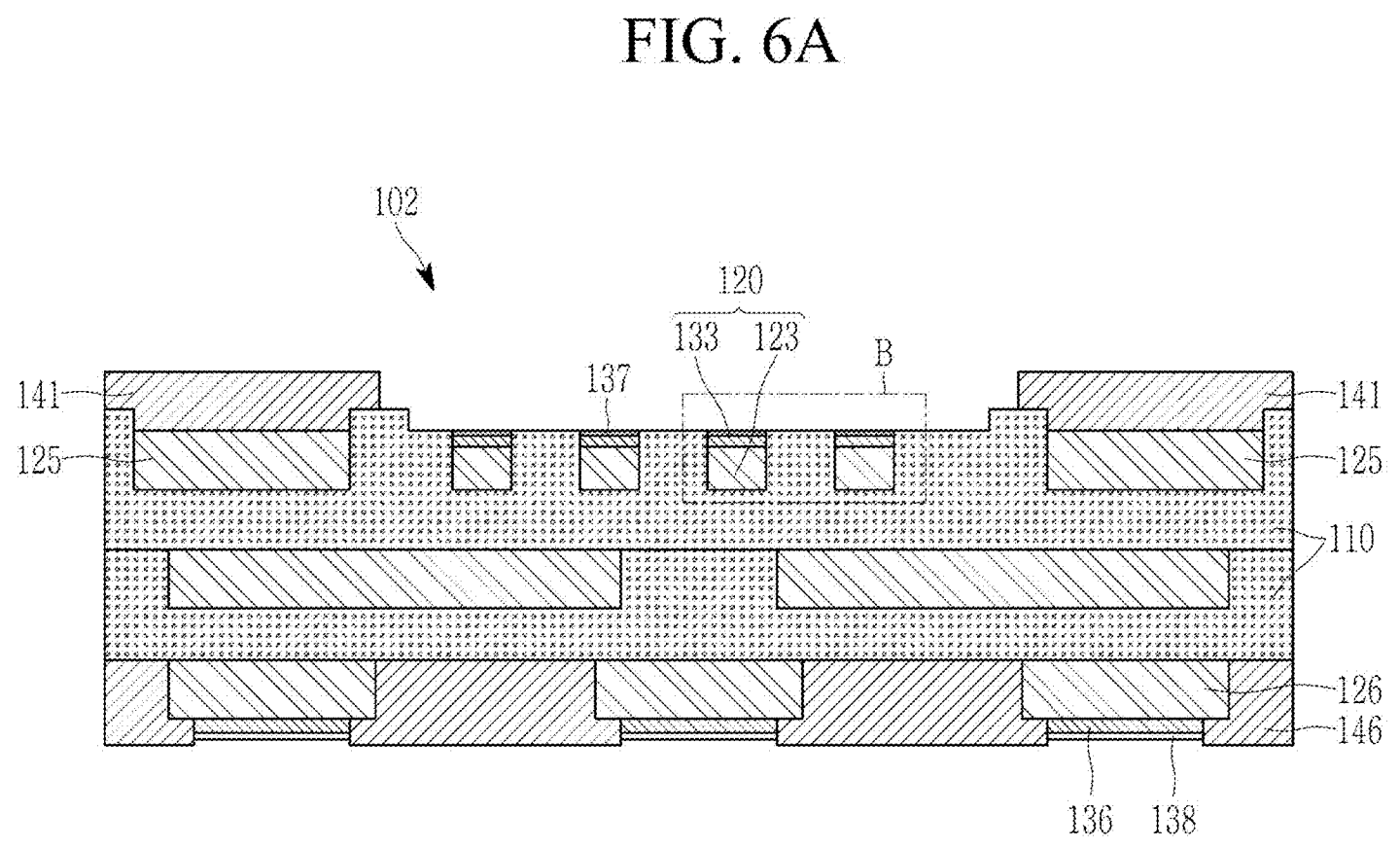
Figure 6B:
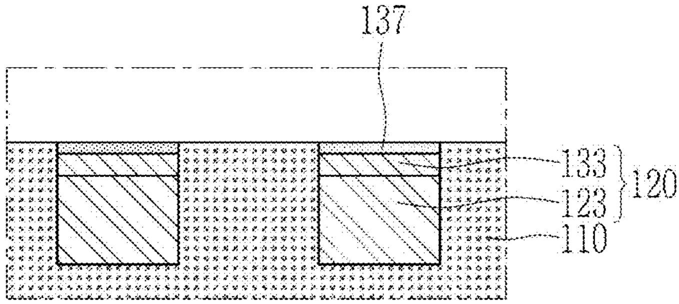
FIG. 6B and FIG. 7B are each an enlarged view of an area B and an area C illustrated in FIG. 6A and FIG. 7A, respectively.
Figure 7A:
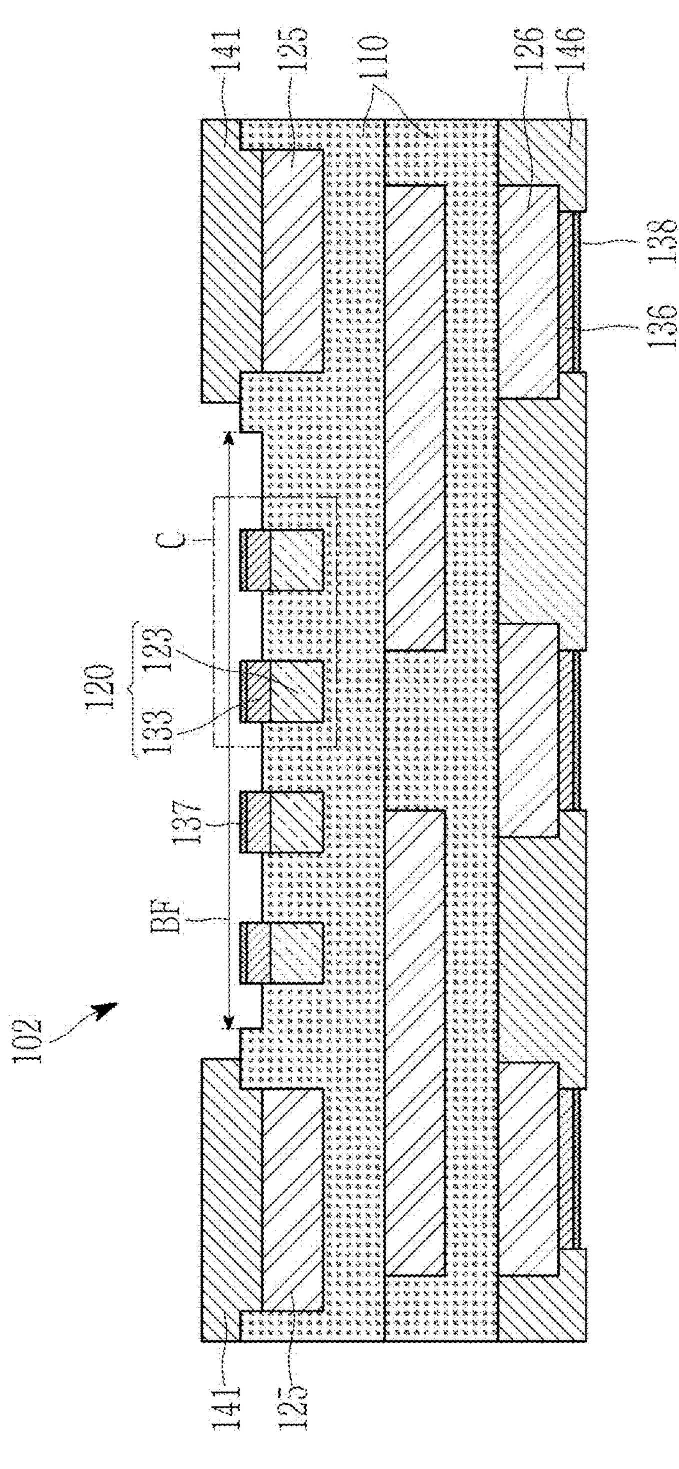
Figure 7B:
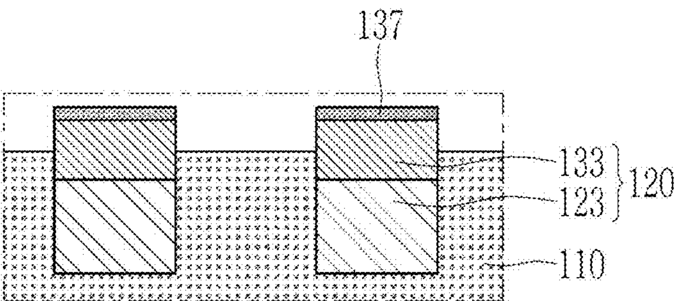

FIG. 6A and FIG. 7A show processing diagrams of a method for manufacturing a circuit board according to another embodiment. FIG. 6B and FIG. 7B are each an enlarged view of the area B and the area C illustrated in FIG. 6A and FIG. 7A, respectively.

According to the method for manufacturing a circuit board 102 according to the present embodiment, the first pad layer 120 is formed up to the second conductive layer 137 and a plasma etching process is performed before it protrudes above the insulation layer 110.

Referring to FIG. 6A, a second conductive layer 137 is formed on the first conductive layer 133 of the substrate obtained in FIG. 3D. The first pad layer 120 including the first connection pad 123 and the first conductive layer 133 may be recessed in the exposed first surface 1101 of the insulation layer 110. A second conductive layer 137 may be plated and disposed in a recessed space formed on the first conductive layer 133. A second conductive layer 138 may be plated and disposed on the second connection pad 126 and the first conductive layer 136 disposed on the second surface 1102 of the insulation layer 110.

Referring to FIG. 7A, as in FIG. 4A, when a patterned covering mask is covered on the surface of the substrate and plasma etching is performed, the insulation layer 110 may be etched such that the first conductive layer 133 and the second conductive layer 137 may protrude above the first surface 1101. That is, part of the insulation layer 110 corresponding to the bond finger region BF is etched so that the first conductive layer 133 and the second conductive layer 137 may be exposed and may protrude.

In the present embodiment, the second conductive layer 137 may be disposed on the protruding upper surface of the first conductive layer 133 and may not be disposed on the exposed lateral surface. That is, while the first conductive layer 133 is buried lower than the surface of the insulation layer 110, the second conductive layer 137 is plated on top of the first conductive layer 133. Therefore, the second conductive layer 137 is not disposed on the lateral surface of the first conductive layer 133.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising: an insulation layer having a first surface and a second surface facing each other; a first pad layer including a first connection pad and a first conductive layer stacked on the first connection pad, a portion of the first pad layer being buried in the insulation layer, and another portion of the first pad layer protruding from the first surface of the insulation layer; a second conductive layer disposed on the first pad layer and the first conductive layer; and a solder resist layer disposed on the insulation layer such that the solder resist layer is spaced apart from the first conductive layer, wherein the first pad layer is disposed in a bond finger region, wherein, in a thickness direction of the insulating layer, a central portion of a lower surface of the first connection pad directly contacts the insulation layer, wherein the insulation layer includes a plurality of insulation layers, and the plurality of insulation layers include a plurality of circuit layers thereon, wherein the solder resist layer is disposed adjacent to the bond finger region and on at least one circuit layer among the plurality of circuit layers, wherein an upper surface of the insulation layer disposed in the bond finger region is lower than an upper surface of the insulation layer adjacent to the bond finger region, and wherein the second conductive layer covers a lateral surface of the first conductive layer protruding from the first surface.

2. The circuit board of claim 1, wherein the first connection pad is buried in the insulation layer, and an upper surface of the first connection pad is recessed into the insulation layer.

3. The circuit board of claim 2, wherein the first conductive layer overlaps the upper surface of the first connection pad in the thickness direction of the insulation layer, and a portion of the first conductive layer is buried in the insulation layer and another portion of the first conductive layer protrudes from the first surface.

4. The circuit board of claim 3, wherein the second conductive layer is disposed on an upper surface of the first conductive layer protruding from the first surface.

5. The circuit board of claim 1, wherein
the first connection pad includes a copper (Cu) layer.

6. The circuit board of claim 1, wherein
the first conductive layer includes a nickel (Ni) plating layer.

7. The circuit board of claim 1, wherein
the second conductive layer includes a gold (Au) plating layer.

8. The circuit board of claim 1, wherein
a width of the first conductive layer is substantially equal to a width of the first connection pad.

9. A method of manufacturing the circuit board of claim 1, comprising:
providing an embedded pattern substrate including the insulation layer, and the first connection pad buried in the insulation layer to be recessed into the insulation layer;
forming the first pad layer by stacking the first conductive layer on the first connection pad to overlap the first connection pad;
etching the insulation layer such that the first surface of the insulation layer is disposed between an upper surface and a lower surface of the first pad layer; and
forming a second conductive layer on the first conductive layer.

10. The method of claim 9, further comprising, before the providing of the embedded pattern substrate,
forming the embedded pattern substrate including
burying the first connection pad in the insulation layer, and
etching an upper surface of the first connection pad to be recessed into the insulation layer.

11. The method of claim 9, wherein
the etching of the insulation layer includes etching using a plasma treatment process.

12. The method of claim 9, wherein
the etching of the insulation layer includes
forming an upper surface of the first connection pad to be recessed into the insulation layer; and
forming an upper surface of the first conductive layer to be higher than the first surface of the insulation layer.

13. The method of claim 9, wherein
the etching of the insulation layer is performed such that the first conductive layer protrudes from the insulation layer, and then the forming of the second conductive layer includes plating the second conductive layer on the first conductive layer to form the second conductive layer.

14. The method of claim 9, wherein
the forming of the second conductive layer includes plating the second conductive layer on the first conductive layer before the etching of the insulation layer.

* * * * *